United States Patent [19]

Schade, Jr.

[11] 4,267,519

[45] May 12, 1981

[54] OPERATIONAL TRANSCONDUCTANCE AMPLIFIERS WITH NON-LINEAR COMPONENT CURRENT AMPLIFIERS

[75] Inventor: Otto H. Schade, Jr., North Caldwell, N.J.

[73] Assignee: RCA Corporation, New York, N.Y.

[21] Appl. No.: 76,674

[22] Filed: Sep. 18, 1979

[51] Int. Cl.³ .............................................. H03F 3/45
[52] U.S. Cl. .................................. 330/255; 330/253; 330/257; 330/288
[58] Field of Search ............... 330/253, 255, 257, 288, 330/301

[56] References Cited

U.S. PATENT DOCUMENTS

| | | |
|---|---|---|
| 3,614,645 | 10/1971 | Wheatley, Jr. . |
| 3,629,691 | 12/1971 | Wheatley, Jr. ........................... 323/1 |
| 3,855,540 | 12/1974 | Leidich . |
| 3,986,048 | 10/1976 | Okada et al. .......................... 307/229 |
| 4,063,149 | 12/1977 | Crowle .................................... 323/4 |

FOREIGN PATENT DOCUMENTS 2157756  6/1972 Fed. Rep. of Germany .
2322466 11/1974 Fed. Rep. of Germany .......... 330/257

Primary Examiner—James B. Mullins
Attorney, Agent, or Firm—E. M. Whitacre; P. J. Rasmussen; Allen LeRoy Limberg

[57] ABSTRACT

Operational transconductance amplifiers are described in which the balanced output currents of a preliminary amplifier stage are applied to the input connections of first and second current amplifiers. A third current amplifier has an input connection to which the output connection of the second current amplifier is connected and has an output connection connected to an output signal terminal to which the output connection of the first current amplifier also connects. At least one of the current amplifiers is a non-linear current amplifier with current gain as between its input and output connections that increases with increasing input current. This increases the capability of the amplifier to source or sink output current without increasing quiescent power consumption.

14 Claims, 3 Drawing Figures

OPERATIONAL TRANSCONDUCTANCE AMPLIFIERS WITH NON-LINEAR COMPONENT CURRENT AMPLIFIERS

The present invention relates to operational transconductance amplifiers and, more particularly, to improvement of their output current sourcing and/or sinking capability for given quiescent power consumption by using component current amplifiers which exhibit increased current gain with increasing input current.

This contrasts with prior art operational transconductance amplifiers, in which the balanced output currents of a preliminary amplifier stage are applied to the input connections of first and second current amplifiers with invariant current gains, and in which a third current amplifier with invariant current gain has an input connection from the output connection of the second current amplifier and has an output connection which connects to an output signal terminal to which the output connection of the first current amplifier is also made. The operational transconductance amplifiers, the canonic form of operational amplifier with very low input impedance and very high output impedance (or current source output), was first described by C. F. Wheatley, Jr. in U.S. Pat. No. 3,614,645 issued Oct. 19, 1971 and entitled "DIFFERENTIAL AMPLIFIER". The particular form of operational transconductance amplifier (OTA) described at the outset of this paragraph is described by H. Moeder in West German Offenlegungsschrift No. 2322466 published Nov. 21, 1974 and entitled "OPERATIONS-VERSTAERKER".

In OTA's embodying the present invention the current sourcing or sinking capability at the output signal terminal is improved for given quiescent current by replacing at least one of the first, second and third current amplifiers with a non-linear current amplifier. These capabilities are of particular use in voltage-follower applications where the output signal terminal of the OTA is directly connected to its inverting input signal terminal.

Figure 1:
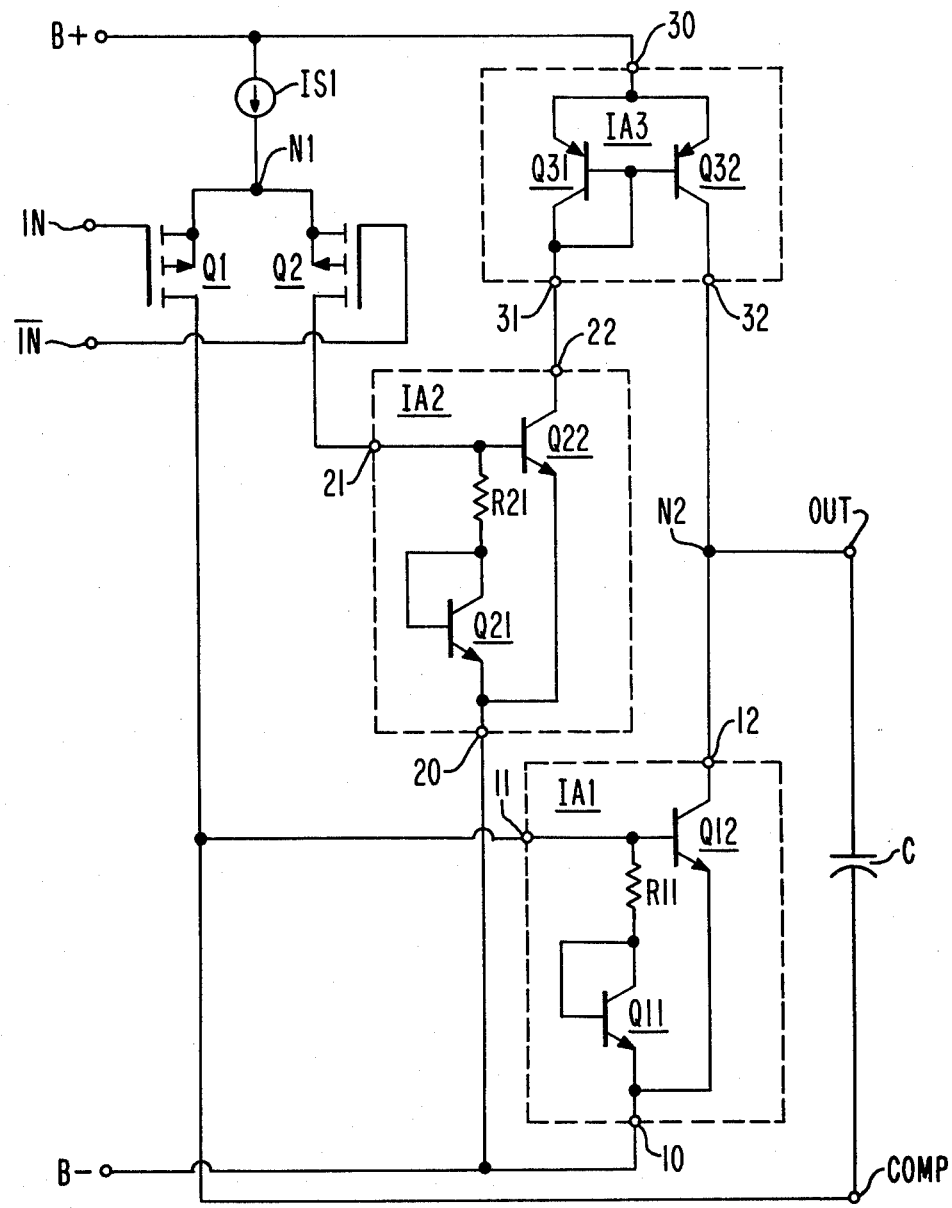
FIG. 1 is a schematic diagram of an operational transconductance amplifier, in accordance with the present invention, including non-linear component current amplifiers.

The FIG. 1 OTA is suitable for monolithic integrated circuit construction using RCA Corporation's BiMOS process, for example. Terminals B+ and B− are for receiving relatively positive and relatively negative operating voltages, respectively. Terminals IN and $\overline{\text{IN}}$ are non-inverting and inverting input signal terminals, respectively, shown connected to the gate electrodes of p-channel metal-oxide-semiconductor field effect transistors Q1 and Q2, respectively. Q1 and Q2 are connected in long-tailed-pair configuration with a constant current generator IS1 supplying their combined source currents to a nodal connection N1 between their respective source electrodes. This long tailed pair configuration acts as a preliminary amplifier responding to a differential-mode input signal voltage between the terminals $\overline{\text{IN}}$ and IN for providing current variations, that swing in opposite senses and are superimposed on similar quiescent currents, at the drains of Q1 and Q2, respectively. (This preliminary amplifier stage may take other forms, of course—e.g., similar to the well-known "741" type of input stage found in integrated circuit operational amplifiers with type numbers including the number 741.)

The output currents with signal variations from the preliminary amplifier, which are positive currents, are applied to respective ones of the input connections 11 and 21 of first and second current amplifiers IA1 and IA2, respectively. The common connections 10 and 20, respectively, of IA1 and IA2 both are to the relatively-negative-operating-voltage bus connected to the terminal B−. Current amplifier IA1 responds to positive current applied to its input connection 11 to supply a negative current from its output connection 12—i.e. to present a demand for positive current flow to its output connection 12 to a connection node N2. Current amplifier IA2 responds to positive current applied to its input connection 21 to supply a negative current from its output connection 22 to the input connection 31 of a third current amplifier IA3—i.e. to present a demand for positive current flow from input connection 31 of IA3. The common connection of IA3 is to the relatively-positive-operating-voltage bus connected to terminal B+, and IA3 responds to current flow through its input connection 31 to supply positive current to node N2. The difference between the current supplied node N2 from the output connection 32 of IA3 and the current demanded at node N2 by the output connection 12 of IA1 flows from node N2 via an output signal terminal OUT to the load (not shown) of the FIG. 1 OTA.

The dominant roll-off of OTA amplitude response with increasing frequency is established by a capacitor C connected between terminal OUT and a compensation terminal COMP, which latter terminal connects back to the input connection 11 of current amplifier IA1. Capacitor C may be integrated with the rest of the OTA, or may be an external discrete component.

The FIG. 1 OTA is similar to that described by Moeder in that current amplifier IA3 is shown as being of a type commonly known as a "current mirror amplifier" used for balanced to single-ended signal conversion of the output currents of current amplifiers, the resulting single-ended current flowing from node N2 via terminal OUT to the OTA load. To this end, PNP transistor Q31 of IA3 is provided with a collector-to-base feedback connection conditioning it to operate as a current-to-voltage converter; and PNP transistor Q32 of IA3 is connected to operate as a subsequent voltage-to-current converter.

The capability of the FIG. 1 OTA to sink current through output signal terminal OUT, when terminal $\overline{\text{IN}}$ is made positive in potential respective to terminal IN, is enhanced by current amplifier IA1 being of a type that exhibits increased current gain with increased input current to its input connection 11. At low input current levels, where potential drop across resistor R11 is negligibly small, NPN transistors Q11 and Q12 operate like the current-to-voltage and voltage-to-current converter portions, respectively, of a current mirror amplifier, the current gain of which as between connections 11 and 12 is determined by the relative sizes of their base-emitter junctions (supposing them to be vertical structure devices per conventional practice). As increased input current levels to input connection 11 of IA1 flow through the series connection of R11 and diode-connected Q11, the emitter-to-base voltage of Q11 is increased over that of Q12 by the potential drop across R11, resulting in current gain that is increased over that provided by a current mirror amplifier.

The capability of the FIG. 1 OTA to source current through terminal OUT, when terminal IN is made positive in potential respective to terminal $\overline{\text{IN}}$, is enhanced by current amplifier IA2 being of a type that exhibits increased current gain with increased input current to its input connection 21. Current amplifier IA2 comprises NPN transistor Q21 arranged for current-to-voltage conversion, resistor R21 arranged for augmenting the current-to-voltage conversion, and NPN transistor Q22 arranged for voltage-to-current conversion—corresponding to elements Q11, R11, and Q12, respectively, of current amplifier IA1.

To obtain a reasonably larger ratio between the maximum output current that can be sourced or sinked via terminal OUT and the quiescent current flowing from output connection 32 of IA3 to the output connection of IA1—e.g., ranging from 10:1 to 100:1 —R11 and R21 preferably are of such resistance to have a 60 to 80 millivolt quiescent potential drop across them.

Figure 2:
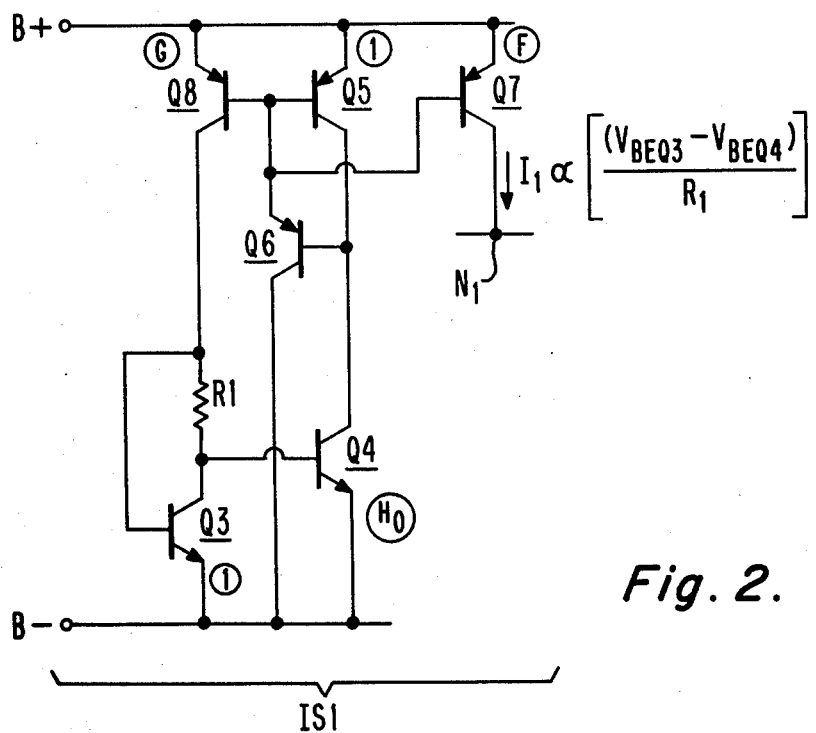
FIG. 2 is a schematic diagram of a current supply of a type particularly well-suited for use in the FIG. 1 OTA.

FIG. 2 is a representative form of the preferred type of constant current generator IS1. This type of constant current generator supplies a current $I_1$ which is proportional to $\Delta V_{BE}/R_1$. $\Delta V_{BE}$ is the difference between the respective emitter-to-base offset potentials $V_{BEQ3}$ and $V_{BEQ4}$ of two NPN transistors Q3 and Q4 operated at substantially the same temperature as each other and as Q11, Q12, Q21 and Q22. $R_1$ is the resistance of a resistor R1 and tracks the resistances of R11 and R21. This current $I_1$ when applied to node N1 is, under quiescent conditions, apportioned as equal source currents to Q1 and Q2, subsequently flowing as their respective drain currents through R11 and R21 respectively. The quiescent potential drops across R11 and R21 are thus proportional to $\Delta V_{BE}$ by factors that do not depend upon the absolute values of R11 and R21, which values cannot be accurately predicted during monolithic integrated circuit manufacture, but those factors instead depend upon the ratios between each of these resistors and R1, which can be accurately predicted. The voltage appearing across the series connection of resistor R11 and diode-connected transistor Q11 resembles, then, the emitter-to-base offset potential of a transistor operated at slightly higher current level than Q11. So by comparison to the analogous conventional CMA structure, one can deduce that the proportionality between the quiescent current through this series connection and the quiescent collector-to-emitter current of Q12 will remain at a predetermined value irrespective of changes in temperature or of process variables in the making of the transistors. The voltage appearing across the series connection of resistor R21 and diode-connected transistor Q21 resembles the emitter-to-base potential of a transistor operated at slightly higher current level than Q21, and the proportionality between the quiescent current through this series connection and the quiescent collector-to-emitter current of Q22 will remain at predetermined value irrespective of changes in temperature or of process variables in the making of the transistors.

The particular constant current generator IS1 shown in FIG. 2 was first described by B. Crowle in U.S. Pat. No. 4,063,149 issued Dec. 13, 1977 and entitled CURRENT REGULATING CIRCUITS. PNP transistor Q5 is conditioned by direct-coupled collector-to-base feedback via emitter-follower PNP transistor Q6 to operate as the input-current-to-voltage converter portion of a dual-output CMA, also including PNP transistors Q7 and Q8 connected to operate as voltage-to-output current converters. The output current from the collector of Q7 is applied as $I_1$ to node N1. Q5, Q7 and Q8 are arranged to exhibit collector currents in 1:F:G ratio for like emitter-to-base voltages; this can be accomplished by constructing them as a plural-collector lateral-structure transistor means with respective collector regions scaled in area to provide collection efficiencies in appropriate ratio. Q3 and Q4 are configured to operate as a CMA with gain $-H_0$ at low input current levels, and as a current amplifier with decreasing current gain $-H$ at increasing input current levels owing to $V_{BEQ4}$ being reduced respective to $V_{BEQ3}$ by the attendant potential drop across resistor R1. G, G, and $H_0$ are all positive constants. The product of G times H is chosen to exceed unity. So, a loop connection of the portion of the dual-output CMA comprising Q5, Q6, Q8 which exhibits a current gain of $-G$, and the current amplifier, which exhibits a current gain $-H$ decreasing from an initial value of $-H_0$, is regenerative to increase current levels therein until the potential drop across $R_1$ reduces closed loop gain GH to unity.

In accordance with Crowle's teaching, in equilibrium condition the potential drop $V_{R1}$ across R1 has a value substantially equal to $(KT/q)\ln(GH_0)$ where K is Boltzmann's constant, T is the temperature Q3 and Q4 are operated at, and q is the charge on an electron. The collector current of Q8 required to maintain this drop has a value substantially equal to $(KT/qR_1)\ln(GH_0)$; the collector current of Q8 is F/G times as large and has a value $(FKT/GqR_1)\ln(GH_0)$.

Other current supplies of the preferred type are described by C. F. Wheatley, Jr. in U.S. Pat. No. 3,629,691 issued Dec. 21, 1971 and entitled "CURRENT SOURCE" and by Te Winkel in German Offenlegungsschrift No. 2157756 entitled "STROMQUELLANORDNUNG", for example.

An OTA requiring only enhanced output current sinking capability can be provided by modifying the FIG. 1 OTA to replace non-linear current amplifier IA2 with a linear current amplifier—e.g., of the current mirror amplifier type, as may be realized by simply replacing R21 with a substantially impedance-free connection. An OTA requiring only enhanced output current sourcing capability can be provided by modifying the FIG. 1 OTA to replace non-linear current amplifier IA1 with a linear current amplifier—e.g., of the current mirror amplifier type, as may be realized by simply replacing R11 with a substantially impedance-free connection. Enhanced output current sourcing capability can be provided by making current amplifier IA3 non-linear rather than current amplifier IA2, or in addition to IA2. (Resistance may be introduced in series with diode-connected transistor Q31, between the emitter and base electrodes of Q32, to compensate for roll-off with increased frequency of the common-emitter forward current gain of Q32 and secure better current gain linearity).

Any non-linear current amplifier in the types of OTA thus far discussed may alternatively be of another form than that shown in FIG. 1, so long as each exhibits increasing current gain with increasing input current. Examples of such alternatives are current amplifiers similar to those described in U.S. Pat. No. 3,986,048 issued Oct. 12, 1976 to Okada et al and entitled "NON-LINEAR AMPLIFIER".

Figure 3:
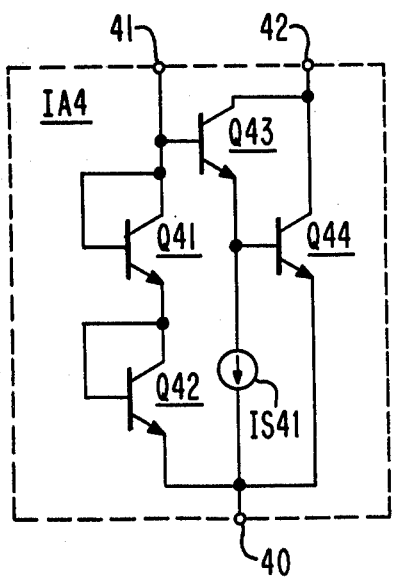
FIG. 3 is a schematic diagram of an alternative type of non-linear current amplifier which, for example, may be substituted for the type of non-linear current amplifier shown in FIG. 1 to generate further OTA structures embodying the present invention.

Non-linear current amplifier IA4 of FIG. 3 is, for example, of a type described by Okada et al, and can replace the type of non-linear current amplifier exemplified by IA1 and IA2. In current amplifier IA4 input current applied between its common connection 40 and input connection 41 is converted to a voltage by the series connection of diode-connected NPN transistors Q41 and Q42. This voltage, exhibiting variations that are two times the voltage across a single diode-connected transistor that varies as logarithm of current, is decremented by the emitter-to-base offset voltage of NPN transistor Q43 from which a substantially constant emitter current is withdrawn by constant current generator IS41. After being so decremented the voltage is applied as the emitter-to-base voltage of NPN transistor Q44 to be converted to a current demand that varies as the square of input current, which demand is made at output connection 42 of IA4. Increasing the current demand of IS41 will reduce the quiescent current demand at output connection 42 to any desired level vis-a-vis quiescent current supplied to input connection 41.

While conventional OTA's operate Class A quasi-linear in their output stages, it will be appreciated that the OTA's described herein are characterized by at least one of their amplifier stages operating Class AB. The output stage of an OTA embodying the present invention and employing a Class AB first current amplifier and a Class AB second or third current amplifier, it will be appreciated, operates Class AB quasi-linear.

Potential dividers dividing in a ratio only slightly in excess of 1:1 connected ante terminal IN and between terminals OUT and $\overline{\text{IN}}$ will result in a potential follower with capability to accommodate rail-to-rail swings from B− to B+ operating voltages in both its input and output circuits.

One skilled in the art of operational amplifier design and armed with the foregoing disclosure will be enabled to generate various embodiments of the present invention, other than those specifically described, and the following claims should be accordingly liberally construed.

What we claim is:

1. An operational transconductance amplifier comprising:
    first and second operating voltage terminals for receiving operating voltages of first and second opposite polarities respective to each other;
    preliminary amplifier means for responding to an input signal to provide signal variations swinging in opposite senses and being superimposed on respective currents of said first polarity at first and second output connections thereof, respectively;
    first and second current amplifiers having respective input connections respectively from the first and from the second output connections of said preliminary amplifier means, having respective common connections to said second operating voltage terminal, and having respective output connections for supplying respective output currents of said second polarity;
    a third current amplifier having an input connection from the output connection of said second current amplifier, having a common connection to said first operating voltage terminal, and having an output connection for supplying an output current of said first polarity;
    an output signal terminal to which the output connections of said first and third current amplifiers connect; and
    the improvement wherein at least one of said first, second, and third current amplifiers is of a type exhibiting a respective current gain as between its input and output connections which increases with increased current to its input connection.

2. An improved operational transconductance amplifier as set forth in claim 1 wherein one of said first, second and third current amplifiers includes:
    a transistor with base, emitter, and collector electrodes at its said input, common, and output connections;
    a linear resistive element; and
    semiconductor diode means connected in series with said linear resistance element between its said input and common connections.

3. An improved operational transconductance amplifier as set forth in claim 1 wherein said first current amplifier includes:
    a transistor with base, emitter, and collector electrodes at the input, common, and output connections of said first current amplifier;
    a linear resistance element; and
    semiconductor diode means connected in series with said linear resistance element between the input and common connections of said first current amplifier.

4. An improved operational transconductance amplifier as set forth in claim 3 wherein said third current amplifier is a current mirror amplifier and wherein second current amplifier includes:
    a further transistor with base, emitter, and collector electrodes at the input, common, and output connections of said second current amplifier;
    a further resistance element, and
    further semiconductor diode means connected in series with said further resistance element between the input and common connections of said second current amplifier.

5. An improved operational transconductance amplifier as set forth in claim 1 wherein said second current amplifier includes:
    a transistor with base, emitter, and collector electrodes at the input, common, and output connections of said second current amplifier;
    a linear resistance element; and
    semiconductor diode means connected in series with said linear resistance element between the input and common connections of said second current amplifier.

6. An improved operational transconductance amplifier as set forth in claim 2, 3, 4, or 5 wherein said preliminary amplifier means includes:
    a pair of additional transistors having respective input electrodes for receiving input signal therebetween, having respective output electrodes respectively connected to the input connection of said first current amplifier and to the input connection of said second current amplifier, and having common electrodes with an interconnection therebetween; and
    constant current generator means for applying a bias current to said interconnection including an additional linear resistance element tracking each aforeclaimed linear resistance element in resistance, including a pair of semiconductor junctions, including means for forward biasing said pair of semiconductor junctions to cause different voltages across them, including means for applying the difference between the voltages across said semiconductor junctions to said additional resistance element to cause a current flow therethrough in accordance with Ohm's Law, and including means proportionally responsive to the current flow through said additional resistance element for supplying said bias current.

7. An improved operational transconductance amplifier as set forth in claim 1 wherein one of said first, second, and third current amplifiers includes:

a plurality of diode-connected transistors in series connection between its common and input connections;

a further transistor having emitter and collector electrodes connected to its common and output connections and having a base electrode, and voltage translation means for applying a voltage decremented from the voltage at its input connection to the base electrode of said further transistor.

8. An amplifier with Class AB quasi-linear output circuitry comprising:

means responsive to applied input signal for supplying balanced current variations superimposed on first and second quiescent currents of a first polarity;

a first current amplifier of non-linear type, with an input connection for receiving as input current said first quiescent current and the current variations superimposed thereon, and with an output connection for supplying output current of a second polarity opposite to said first in Class AB response to its input current;

a second current amplifier, with an input connection for receiving as input current said second quiescent current and the current variations superimposed thereon, and with an output connection for supplying output current of said second polarity responsive to its input current;

A third current amplifier, with an input connection for receiving an input current the output current of said second current amplifier, and with an output connection for supplying an output current of said first polarity responsive to its input current; and an output signal terminal to which the output connections of said first and third current amplifiers connect.

9. An amplifier with Class AB quasi-linear output circuitry as set forth in claim 8 wherein one of said second and third amplifiers is a current mirror amplifier with output current proportional to its input current and the other of said second and third amplifiers is of non-linear type with output current in Class AB response to its input current.

10. An amplifier with Class AB quasi-linear output circuitry comprising:

means responsive to applied input signal for supplying balanced current variations superimposed on first and second quiescent currents of a first polarity;

a first Class AB current amplifier, with an input connection for receiving said first quiescent current and the current variations superimposed thereon, and with an output connection for supplying output current of a second polarity opposite to said first;

a second Class AB current amplifier, with an input connection for receiving said second quiescent current and the current variations superimposed thereon, and with an output connection for supplying output current of said second polarity a current mirror amplifier, with an input connection for receiving as input current the output current of said second Class AB current amplifier, and with an output connection for supplying output current of said first polarity and in proportion to its input current; and an output signal terminal to which the output connections of said first Class AB current amplifier and said current mirror amplifier connect.

11. An amplifier with Class AB quasi-linear output circuitry comprising:

means responsive to an applied input signal for supplying balanced current variations superimposed on first and second quiescent currents of a first polarity;

a first current amplifier with an input connection for receiving said first quiescent current and the current variations superimposed thereon, and with an output connection for supplying output current of a second polarity opposite to said first;

a second current amplifier with an input connection for receiving said second quiescent current and the current variations superimposed thereon, and with an output connection for supplying output current of said second polarity;

a third current amplifier with an input connection for receiving as input current the output current of said second current amplifier, and with an output connection for supplying output current of said first polarity and in proportion to its input current;

an output signal terminal to which the output connections of said first current amplifier and said third current amplifier connect; and the improvement wherein at least one of said first, second and third current amplifiers is of a type each current appplifier of which includes respective means for developing a voltage responsive to the current received at its input condition, respective means included in said means for developing a voltage for withdrawing a predetermined direct current therefrom to decrement said voltage, and respective voltage-to-current converting means for supplying its output current responsive to said decremented voltage.

12. The improvement as set forth in claim 11 wherein said first current amplifier and one of said second and third current amplifiers are of the type called for in claim 11.

13. The improvement as set forth in claim 11 wherein in said one current amplifier:

said voltage-to-current converting means includes a transistor having a collector electrode connected to the output connection of that said one current amplifier, having a base electrode for receiving said decremented voltage, and having an emitter electrode; and said means for developing a voltage further includes diode means connected between the input connection of that said one current amplifier and the emitter electrode of said transistor, and said means for withdrawing a predetermined direct current includes constant current generating means connected to the base electrode of said transistor.

14. The improvement as set forth in claim 13 wherein in said one current amplifier:

said diode means includes a plurality of diode-connected transistors; and said means for developing a voltage further includes a further transistor having emitter and base electrodes connected to the base of said transistor and to the input connection of that said one current amplifier, respectively, and having a collector electrode connected to receive an operating potential.

* * * * *

UNITED STATES PATENT AND TRADEMARK OFFICE
CERTIFICATE OF CORRECTION

PATENT NO. : 4,267,519
DATED : 5/12/81
INVENTOR(S) : Otto Heinrich Schade, Jr.

It is certified that error appears in the above—identified patent and that said Letters Patent is hereby corrected as shown below:

Col. 3, Line 25 — after "them." insert -- In this preferred arrangement Q11 and Q21 are made to have larger emitter-base junction areas than those of Q12 and Q22, respectively, in order to get smaller quiescent current levels from the output circuits of IA1 and IA2 than the quiescent currents that are applied to their input circuits. --;

Col. 4, Line 28 — before "equilibrium" insert -- the -- ;

Col. 4, Line 30 — "$(KT/q)\ln(GH_0)$" should be -- $(KT/q)\ln(GH_0)$ -- ;

Col. 4, Line 34 — "$(KT/qR_1)\ln(GH_0)$" should be -- $(KT/qR_1)\ln(GH_0)$ -- ;

Col. 4, Line 36 — "$(FKT/GqR_1)\ln(GH_0)$" should be -- $(FKT/GqR_1)\ln(GH_0)$ -- ; and

UNITED STATES PATENT AND TRADEMARK OFFICE
CERTIFICATE OF CORRECTION

PATENT NO. : 4,267,519

DATED : 5/12/81

INVENTOR(S) : Otto Heinrich Schade, Jr.

It is certified that error appears in the above—identified patent and that said Letters Patent is hereby corrected as shown below:

Col. 8, Line 49 — "condition" should be -- connection --.

Signed and Sealed this

Eighth Day of December 1981

[SEAL]

Attest:

Attesting Officer

GERALD J. MOSSINGHOFF

Commissioner of Patents and Trademarks